(12) United States Patent
Coronel et al.

(10) Patent No.: US 7,188,411 B2
(45) Date of Patent: Mar. 13, 2007

(54) PROCESS FOR FORMING PORTIONS OF A COMPOUND MATERIAL INSIDE A CAVITY

(75) Inventors: Philippe Coronel, Barraux (FR); Christophe Regnier, St. Hilaire du Touvet (FR); François Wacquant, St. Ismier (FR); Thomas Skotnicki, Crolles (FR)

(73) Assignee: STMicroelectronics S.A., Montrouge (FR)

( * ) Notice: Subject to any disclaimer, the term of this patent is extended or adjusted under 35 U.S.C. 154(b) by 398 days.

(21) Appl. No.: 10/657,514

(22) Filed: Sep. 8, 2003

(65) Prior Publication Data
US 2004/0124468 A1 Jul. 1, 2004

(30) Foreign Application Priority Data
Sep. 27, 2002 (FR) .................................. 02 11989

(51) Int. Cl.
*H01K 3/10* (2006.01)
(52) U.S. Cl. ............................. 29/852; 29/846; 29/847; 29/849; 29/853; 257/347; 257/351; 257/E21.011; 257/E21.588; 438/3; 438/632; 438/655
(58) Field of Classification Search ................ 29/852, 29/846, 847, 849, 853; 257/347, 351, E21.011, 257/E21.588; 438/3, 632, 655
See application file for complete search history.

(56) References Cited

U.S. PATENT DOCUMENTS

| 5,120,666 | A | | 6/1992 | Gotou |
| 5,580,802 | A | | 12/1996 | Mayer et al. |
| 5,583,362 | A | | 12/1996 | Maegawa |
| 5,736,435 | A | * | 4/1998 | Venkatesan et al. ........ 438/151 |
| 6,001,660 | A | * | 12/1999 | Park et al. ..................... 438/3 |
| 2002/0003256 | A1 | | 1/2002 | Maegawa |

FOREIGN PATENT DOCUMENTS

EP    1 091 417    4/2001

OTHER PUBLICATIONS

French Search Report; FR 0211989, dated Aug. 12, 2003.

* cited by examiner

*Primary Examiner*—A. Dexter Tugbang
*Assistant Examiner*—Tim Phan
(74) *Attorney, Agent, or Firm*—Jenkens & Gilchrist, PC

(57) ABSTRACT

A process for forming portions of a compound material within an electronic circuit includes the formation of a cavity having at least one opening facing onto an access surface. The cavity furthermore has an internal wall with at least one region made of an initial material (for example, silicon). A metal is deposited close to the region of initial material. The circuit is then heated to form a portion of the compound material (for example, a silicide) in the region of initial material inside the cavity. The compound material is formed from elements of the initial material and from some of the metal deposited. The excess metal that has not formed some of the compound material is then removed from the cavity.

18 Claims, 8 Drawing Sheets

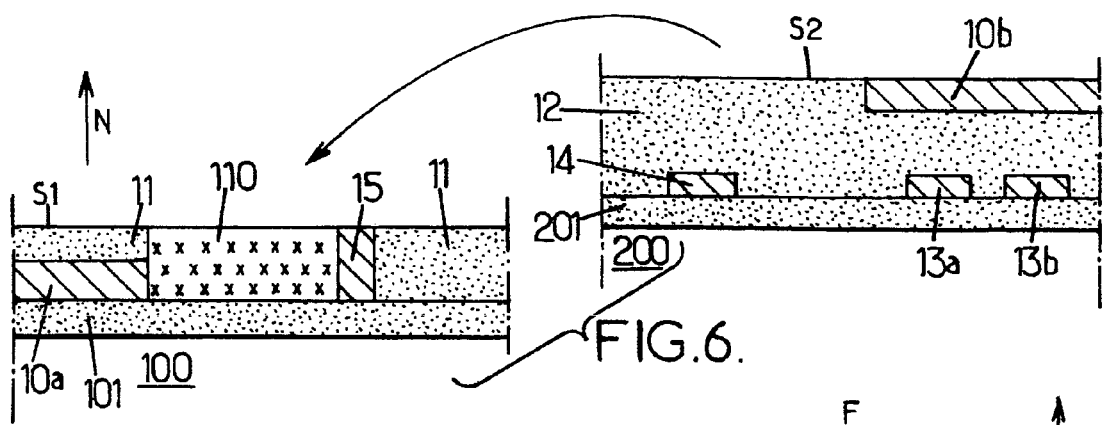
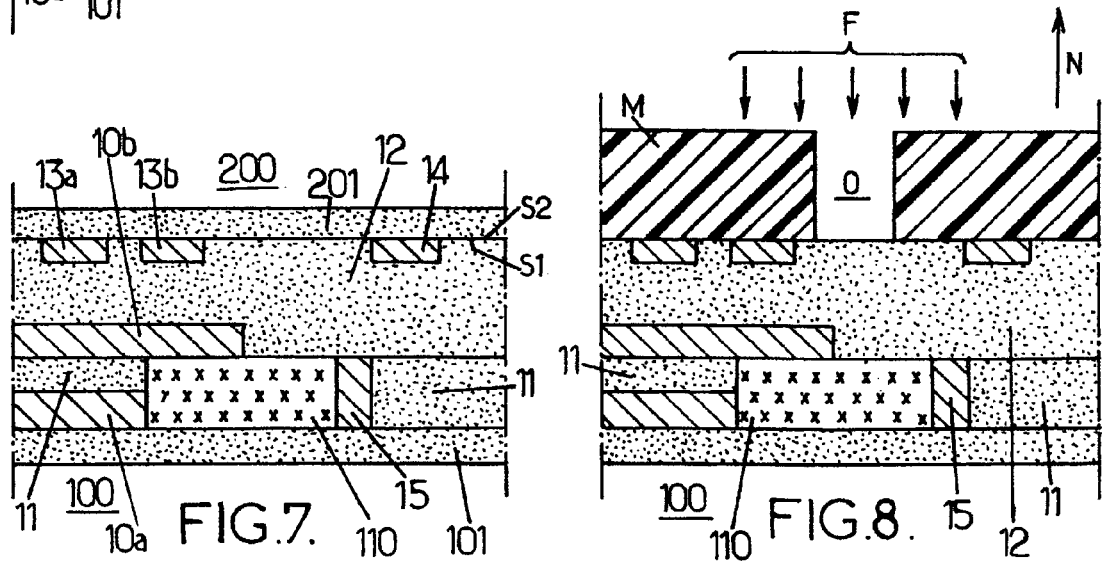
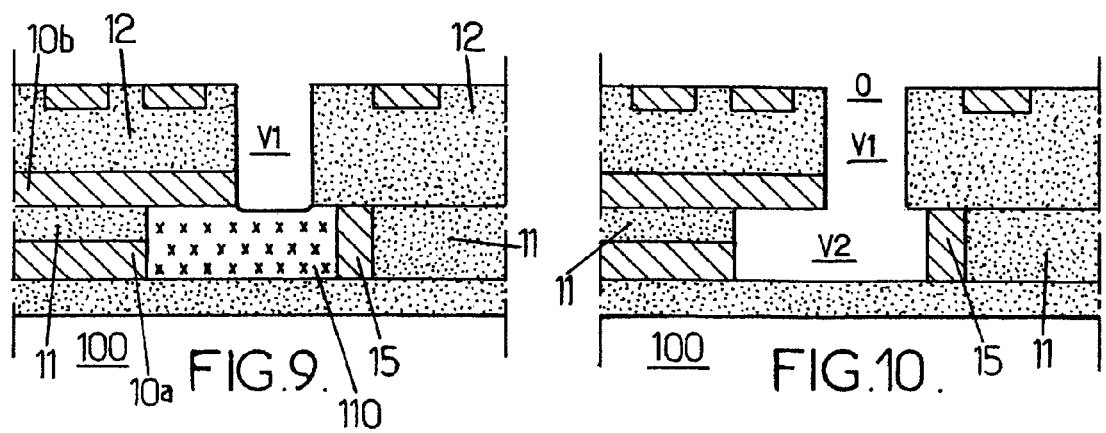

PROCESS FOR FORMING PORTIONS OF A COMPOUND MATERIAL INSIDE A CAVITY

PRIORITY CLAIM

The present application claims priority from French Application for Patent No. 02 11989 filed Sep. 27, 2002, the disclosure of which is hereby incorporated by reference.

BACKGROUND OF THE INVENTION

1. Technical Field of the Invention

The present invention relates to a process for forming portions of a compound material inside a cavity of an integrated circuit device and to an electronic circuit incorporating portions of compound material thus obtained.

2. Description of Related Art

The increase in electrical performance and level of integration of electronic circuits requires the design and fabrication of circuits having complex geometrical configurations. As an example, some field-effect transistors or MOS (Metal Oxide Semiconductor) transistors have a gate which completely surrounds the channel of these transistors so as to obtain better control of the conduction state of the transistor. A conducting part of the gate must therefore be formed beneath the channel, that is to say between the channel and a subjacent substrate that supports the circuit. Such MOS transistors are known as GAA (Gate All Around) transistors.

It is possible to fabricate such GAA transistors by superposing portions of materials formed in succession from the surface of a substrate, as a stack of these portions. In this case, the lower part of the gate is firstly formed above the substrate using a conducting material, then the channel, generally based on silicon, is formed above this lower gate part, and the gate is completed by forming the upper gate part above the channel. Lateral parts of the gate may be formed at the same time as the lower part or as the upper part, but at least two steps for forming the various parts of the gate are needed, making the transistor fabrication process relatively long.

In general, producing a single conducting element in several separate steps gives rise to inhomogeneities within this element, even if the element consists of a single material used in each step of its production. Such inhomogeneities have an undesirable effect on the final electrical behavior of the element.

Moreover, it is known to produce portions of a metal-silicide-type material selectively in defined regions of an electronic circuit. To do this, silicon is initially placed in these regions and, at a stage in the circuit fabrication process in which these regions are exposed, the circuit is covered with a layer of a metal capable of forming a silicide-type compound. The circuit is then heated so as to form this silicide compound in the regions where the metal is in contact with the silicon. After the heating, the metal parts deposited outside the silicon regions therefore remain unaffected and are removed, for example by dissolving them in a suitable chemical solution. Since the silicide is insoluble in the solution used, it remains in the final circuit within the initial silicon regions.

This method of forming silicide portions has a drawback in that the silicon regions within which the silicide is formed must be initially exposed. This constraint may be incompatible with a complex configuration of the electronic circuit.

There is accordingly a need to overcome this drawback in the production of integrated circuit devices.

SUMMARY OF THE INVENTION

The present invention is generally directed to allowing the formation of portions of a compound material in circuit regions that are initially buried, that is to say covered by other constituent materials of the circuit.

The present invention provides a process for forming at least one portion of a compound material formed from elements of an initial material and of a metal within an electronic circuit, comprising the following steps:

(a) formation of a cavity that includes at least one opening onto an access surface and has an internal wall having at least one region of initial material;

(b) deposition of a metal close to said region of initial material;

(c) heating of the circuit so as to form a portion of the compound material in said region of initial material; and (d) removal of at least one portion of the metal that has not formed some of the compound material from the cavity via said opening.

According to the invention, a cavity is firstly formed in the circuit, inside which portions of a compound material are selectively formed from regions of initial material within the cavity. The compound material is formed after deposition in the cavity of a metal which is capable of reacting with the initial material to form the compound material from elements of the initial material and the metal. The excess metal that has not formed some of the compound material is then removed from the cavity.

One advantage of the process of the invention is that it is compatible with many configurations of the electronic circuit. This is because various methods for forming the cavity can be used, and selected according to each circuit configuration.

The cavity formed may especially include a cylindrical or parallelepipedal first volume open to the access surface so as to form, for example, a well starting from an exposed surface of the circuit.

It may also include a second volume into which the first volume runs on the opposite side from the access surface, the second volume extending further than the first volume parallel to the access surface. In this case, the cavity forms a cave connected via a narrow well to the exposed surface of the circuit. The cavity may furthermore have one of the above shapes, opening onto a sidewall of the circuit and being parallel, perpendicular or at any orientation to a surface of a substrate carrying the circuit.

Another advantage of the process of the invention is that there are many possible ways of arranging the portions of compound material, resulting from the initial arrangement of the regions of initial material within the circuit and from the shape of the cavity in these regions. Thus, portions of compound material having the general shape of a pad may in particular be oriented parallel or perpendicular to the access surface.

In a geometrical configuration in which the electronic circuit is placed on a substrate and in which the cavity includes a chimney approximately perpendicular to the surface of the substrate, the chimney allows access to a buried part of the circuit in order to form the portions of compound material. The process of the invention is therefore particularly suitable for circuit structures having several superposed levels of components, or of parts of components, and contributes to a reduction in the cost of the electronic circuit, this reduction being due to a reduction in the size of the substrate.

Yet another advantage of the process of the invention is the possibility of forming several portions of compound material within the circuit simultaneously. To do this, several regions of initial material must be provided in the circuit, and the cavity is formed so as to reach these regions. Optionally, the circuit may also include regions of initial material outside the cavity, where the compound material is formed simultaneously with the portions of compound material formed inside the cavity.

The cavity may be formed in various ways depending on the configuration of the circuit. In particular, it may be formed by removing at least one material of the circuit, especially from the access surface.

Another method for forming the cavity comprises transferring at least one material between a temporary substrate and a final substrate carrying the electronic circuit.

Optionally, these two methods may be combined to obtain a cavity whose shape is tailored to the configuration of the circuit and to the desired arrangement of the portions of compound material. The formation of the cavity may also include a step of constructing materials in a given pattern on the circuit, the pattern helping to define the cavity.

The initial material may comprise silicon, germanium, arsenic, selenium, or a mixed compound comprising at least one of the above elements. When the initial material comprises silicon, the compound material formed is of the metal silicide type.

Step (b) of the process may be carried out in two different ways, depending on the size of the cavity and of its opening onto the access surface. When the cavity and its opening are large enough, step (b) may comprise introducing the metal into the cavity via said opening so as to deposit the metal on at least said region of initial material.

If the cavity and its opening are too small in size to introduce the metal via the opening during deposition of the metal, step (b) then comprises depositing the metal outside the cavity, close to said opening. During the heating of step (c), the deposited metal diffuses into the cavity, via said opening in the cavity, as far as said region of initial material, so as to form a portion of the compound material in said region of initial material.

Several different methods can be used to introduce the metal into the cavity. For example, CVD (Chemical Vapor Deposition) may be used to deposit the metal chemically, starting from gaseous precursor compounds incorporating metal atoms. Such a deposition method is preferably carried out at reduced pressure, in order to allow the metal to be deposited on sides of the cavity that are remote from its opening onto the access surface. Under special conditions, the metal may be deposited by such processes in successive and continuous atomic layers.

Other possible methods for depositing the metal in the cavity use a chemical solution introduced into the cavity, which incorporates dissolved compounds based on the metal in an oxidized form. In one of these methods, called the electroless method, reducing compounds are then added to the solution, which cause the metal to be released in the form of a conducting layer coating the cavity.

The metal deposited using one of the above methods, and capable of forming a compound material, may be cobalt, tantalum, tungsten, titanium, aluminum, copper, silver, platinum, nickel, or an alloy comprising at least one of these metals. The compound material formed may be electrically conducting, depending on the role of the portions of compound material within the electronic circuit.

The operation of introducing the metal into the cavity, in order to deposit it in the region or regions of initial material inside the cavity, is preferably carried out so as not to completely fill the cavity. Thus, any stresses that appear during heating and during formation, in the cavity, of the compound material are limited. This electronic circuit caused by such stresses.

The process of the invention may furthermore be used to connect, via bridges of compound material, several regions of initial material within the cavity. To do this, the internal wall of the cavity has at least two regions of initial material separated by an intermediate region of a material other than the initial material. During step (c) in which the circuit is being heated, the initial material of at least one of said regions of initial material is made to diffuse into the metal so as to form a portion of compound material connecting said regions of initial material.

The invention also relates to an electronic circuit comprising a portion of compound material formed in the manner described above. In particular, the portion of compound material may constitute at least one electrical connection within this circuit.

The invention also relates to an MOS transistor comprising a gate having a portion of compound material formed using the above process, and to an electronic circuit comprising such an MOS transistor.

BRIEF DESCRIPTION OF THE DRAWINGS

A more complete understanding of the method and apparatus of the present invention may be acquired by reference to the following Detailed Description when taken in conjunction with the accompanying Drawings wherein:

FIGS. 6 to 13 are sectional views showing various steps in the production of electrical connections using another method of implementing the invention.

DETAILED DESCRIPTION OF THE DRAWINGS

In the FIGURES, for the sake of clarity, the dimensions of the various parts of the components or circuits shown are not in proportion to their actual dimensions.

FIGS. 2a–2d, 3a–3d, 4a–4d and 6–13 are sectional views of at least one substrate and of various materials placed on a planar surface of this substrate. The sectional views are taken in planes perpendicular to the surface of the substrate. In the FIGURES, identical references correspond to similar elements. N denotes the direction perpendicular to the surface of the substrate and oriented upwards in the FIG- URES, the substrate being placed in the lower part of the FIGURES. The terms "on top of", "beneath", "on", "under", "upper" and "lower" used hereafter refer to this orientation.

A first method of implementing the process of the invention will now be described in detail within the context of the fabrication of a GAA-type MOS transistor, the gate of which is made of a metal silicide.

Figure 1A:
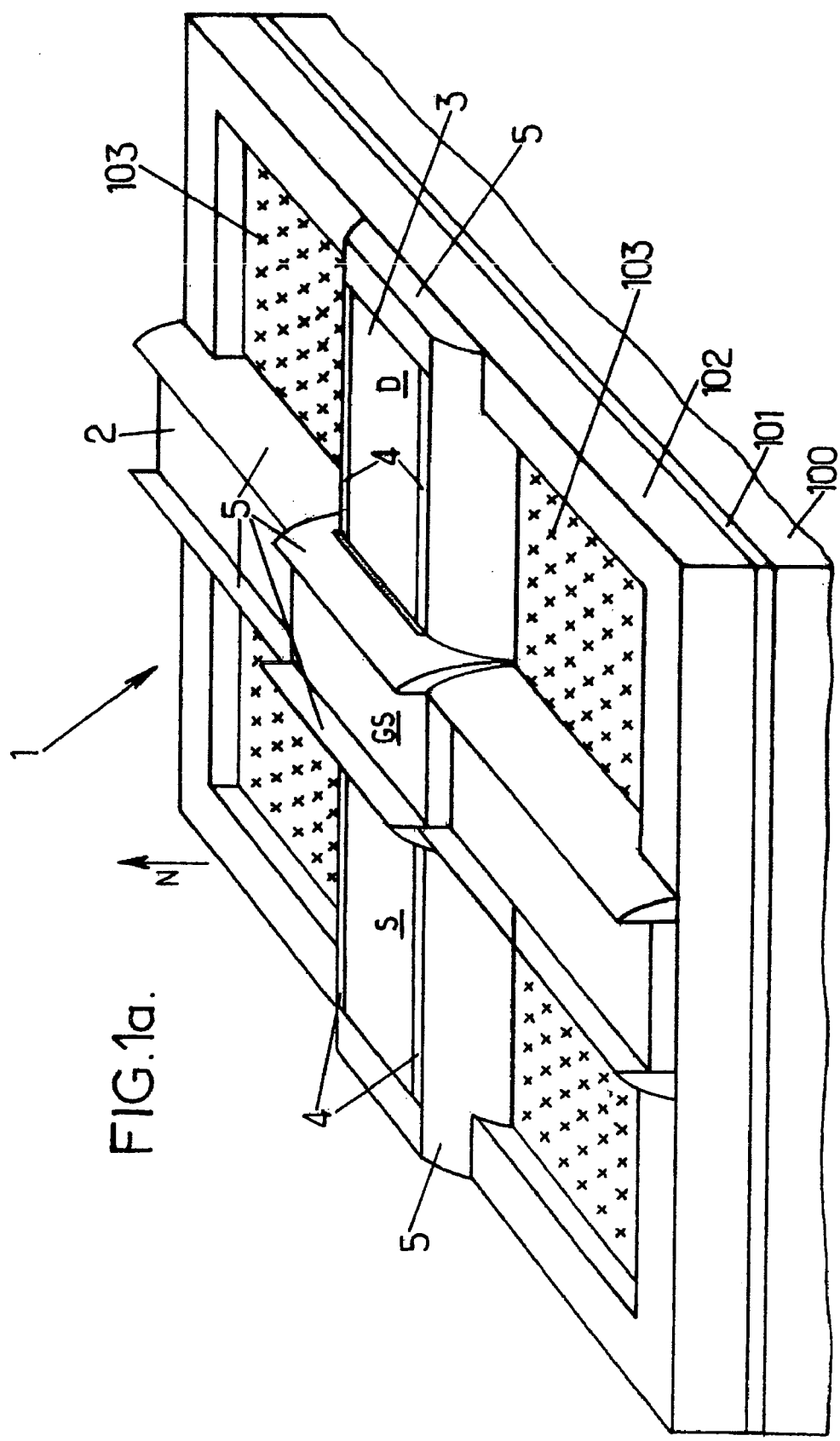
FIGS. 1a and 1b are perspective views of a field-effect transistor during fabrication according to a first method of implementing the invention.

FIG. 1a is a perspective view of a transistor 1 in the course of fabrication. The transistor 1 is fabricated on top of a substrate 100, for example made of silicon, covered with a layer 101 of insulating material, for example silica $SiO_2$. A silica rim 102, of rectangular section, placed on the layer 101 surrounds a rectangular portion of that upper surface of the layer 101 which is occupied by the transistor 1 and defines a central depression.

This depression is filled with a temporary material 103, such as a silicon-germanium alloy, up to about two thirds of the height of the rim 102.

A first transverse structure, the ends of which are referenced S and D, connects two opposed sides of the rim 102, bearing on the latter at each of its ends and on the temporary material 103 in its central part.

Figure 2A:
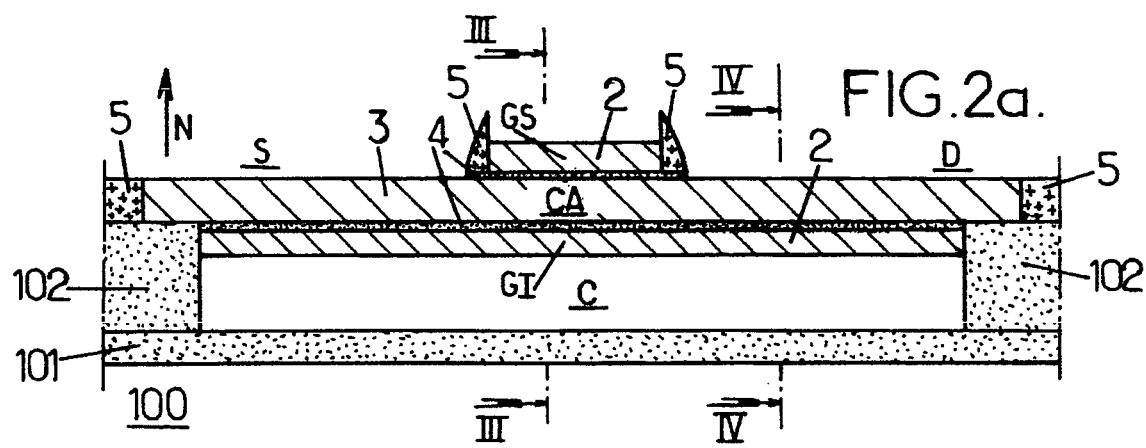
FIGS. 2a–2d are sectional views, on the plane II—II indicated in FIGS. 1b and 3a–3d, illustrating successive steps in the fabrication of the transistor of FIG. 1 in accordance with the first method of implementing the invention.

FIG. 2a shows a section of the transistor 1 being fabricated in a vertical plane of symmetry II parallel to the first transverse structure. The central part of this structure is formed by a bar 3 of silicon, possibly single-crystal silicon, surrounded by a silica layer 4. The layer 4 extends between the two opposed sides of the rim 102 beneath the bar 3, as can be seen in FIG. 2a, and is present on top of the bar 3 only in a central part of the latter. In this central part, the layer 4 is furthermore covered with a portion of a silicon volume 2 flanked by two vertical walls 5 of electrically insulating material, for example silicon nitride $Si_3N_4$. The first transverse structure furthermore includes, at each of its ends bearing on the rim 102, two insulating edges 5, also made of silicon nitride. These insulating edges are each connected to the vertical walls 5 which flank the portion of silicon volume 2 via two other silicon nitride walls that run along the sidewalls of the first structure.

Figure 3A:
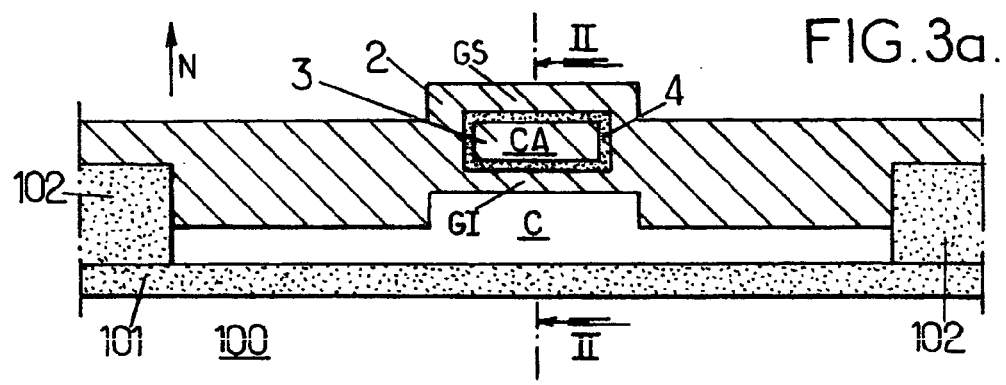
FIGS. 3a–3d are sectional views, on the plane III—III indicated in FIGS. 1b and 2a–2d, illustrating the same successive steps in the fabrication of the transistor.

A second transverse structure intersects the first transverse structure at right angles, bearing on the other two opposed sides of the rim 102 and on the temporary material 103. The temporary material 103 may have a central raised part beneath the second transverse structure, which follows the shape of the lower surface of this second transverse structure seen in FIG. 3a. FIG. 3a corresponds to a section of the transistor 1 being fabricated in a vertical plane of symmetry III parallel to the second transverse structure. The silicon volume 2 forms the main part of the second transverse structure and completely surrounds, at its center, the first transverse structure. Additional walls of silicon nitride cover the side walls of the second transverse structure, these being connected to the silicon nitride walls of the first transverse structure at each internal corner of the intersection of the two transverse structures.

Figure 4A:
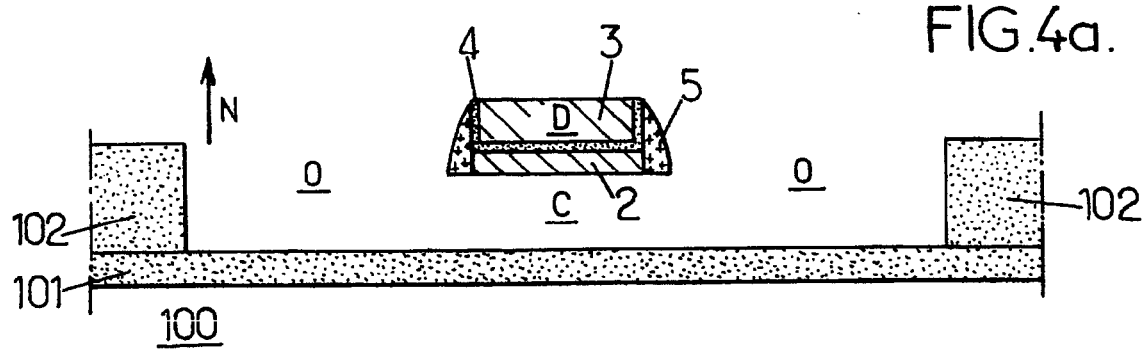
FIGS. 4a–4d are sectional views, on the plane IV—IV indicated in FIGS. 1b and 2a–2d, illustrating the same successive steps in the fabrication of the transistor.

FIG. 4a is a third section of the transistor 1 in a vertical plane IV parallel to the plane III, but offset with respect to the latter as indicated in FIG. 2a, so as to intersect the first transverse structure outside the upper part of the silicon volume 2. FIG. 4a shows a section of the first transverse structure, composed of the silicon bar 3 surrounded laterally and underneath by the silica layer 4. This layer 4 separates the bar 3 from the lower part of the silicon volume 2. The assembly is flanked by two insulating side walls 5. FIG. 1a shows the relative arrangements between the insulating walls 5 shown in FIGS. 2a and 4a, respectively.

The above structure is produced using techniques, known to those skilled in the art, that combine masking and material deposition and etching steps repeated so as to form all the superposed or juxtaposed volumes according to FIGS. 1a, 2a, 3a and 4a.

The silicon bar 3 of the first transverse structure is intended to form the main conducting path of the transistor 1 in its final configuration. Thus, the left end of the first transverse structure in FIGS. 1a and 2a corresponds to the source S, the right end corresponds to the drain D and the central part of the bar 3, visible in FIG. 2a, corresponds to the channel CA of the transistor 1.

In particular, when producing the structure 1 corresponding to FIGS. 2a, 3a and 4a, the silicon bar 3 is appropriately doped, in a manner known to those skilled in the art, in order to exhibit conduction characteristics suitable for use of the transistor 1 as a transistor for switching between an on state and an off state, as a control transistor, as a power transistor or as a transistor more especially suitable for any other use.

Those parts of the volume 2 lying above and below the channel CA are intended to form, in the rest of the process according to the invention, the upper part GS and the lower part GI of the gate that surrounds the channel CA in the plane of FIG. 3a.

During a first step of the process according to the invention the temporary material 103 is removed from its surface portions exposed between the ends of the arms of the first and second transverse structures, inside the rim 102. When the temporary material 103 is a silicon-germanium alloy, one method of selective removal that can be used comprises bringing the exposed parts of the material 103 into contact with an aqueous chemical etching solution which is both oxidizing and acid, composed for example of 40 milliliters of 70% nitric acid $HNO_3$, 20 milliliters of hydrogen peroxide $H_2O_2$ and 5 milliliters of 5% hydrofluoric acid HF. The silicon-germanium alloy is selectively dissolved in this solution, whereas the other materials of the transistor 1, namely the pure or doped silicon, the silica and the silica nitride in the example in question, are left intact.

Figure 1B:
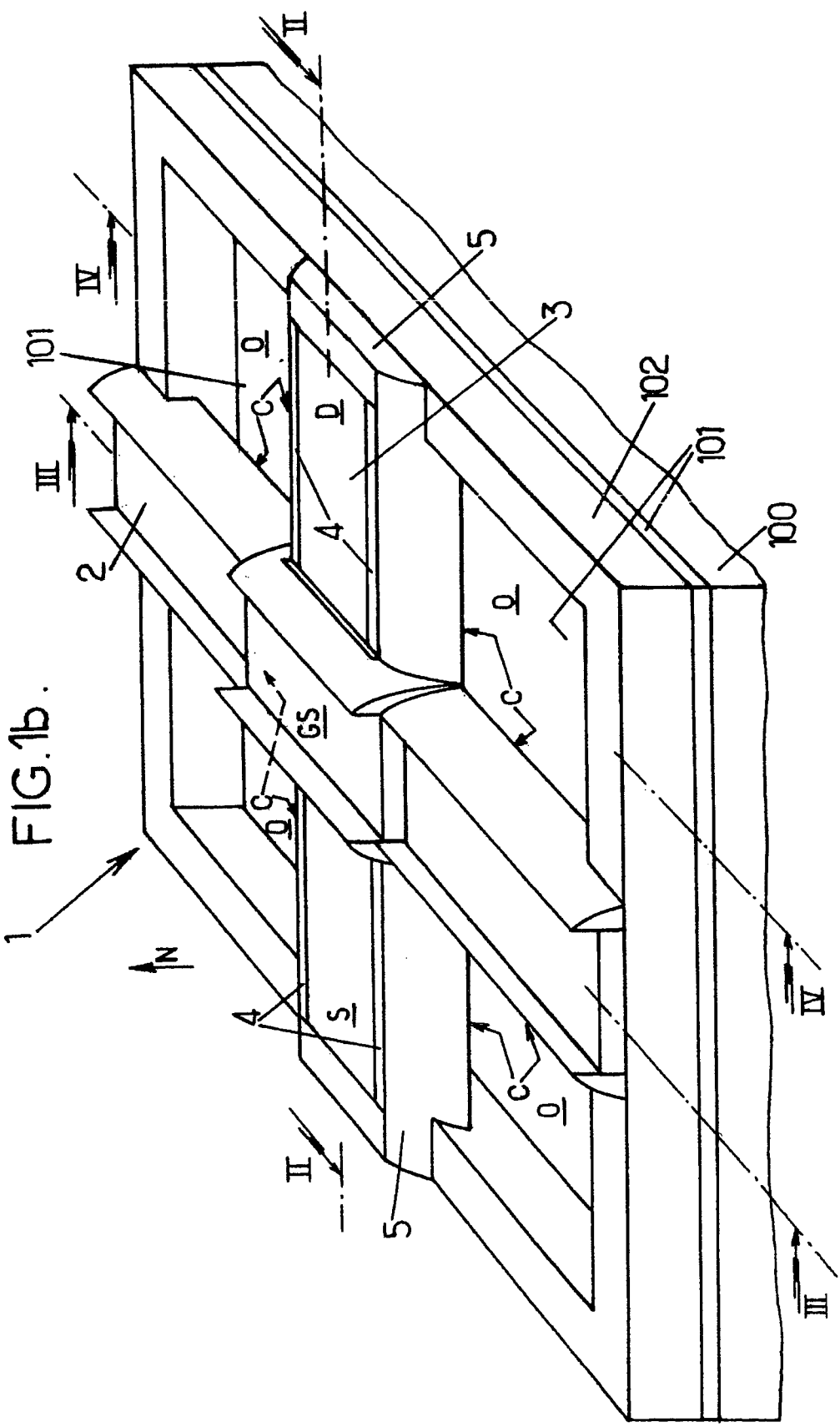

The configuration of the transistor 1 obtained after this selective removal is shown in FIG. 1b. This figure shows the two transverse structures in the form of two respective bridges bearing via their ends on the rim 102, the second structure surrounding the first at the intersection between the two structures. The space initially occupied by the temporary material 103 now corresponds to a cavity C that extends under the two between the arms of the transverse structures and the corners of the rim 102. FIGS. 2a, 3a and 4a correspond to the fabrication stage shown in FIG. 1b, that is to say after the temporary material 103 has been selectively removed.

During a second step, a metal capable of forming a silicide material is deposited on the exposed surfaces of the transistor 1 and inside the cavity C.

This metal may be deposited using one of the processes known to those skilled in the art such as, for example, chemical vapor deposition (CVD). To do this, gaseous precursors, possibly of the organometallic type, are brought into contact with the transistor 1 and react on the exposed surfaces, forming a layer of said metal. Owing in particular to the low gas pressure maintained around the transistor 1 during introduction of the precursors, the latter penetrate into the cavity C via the openings O and cover its entire wall, including in that part facing the inside of the cavity C.

Figure 2B:
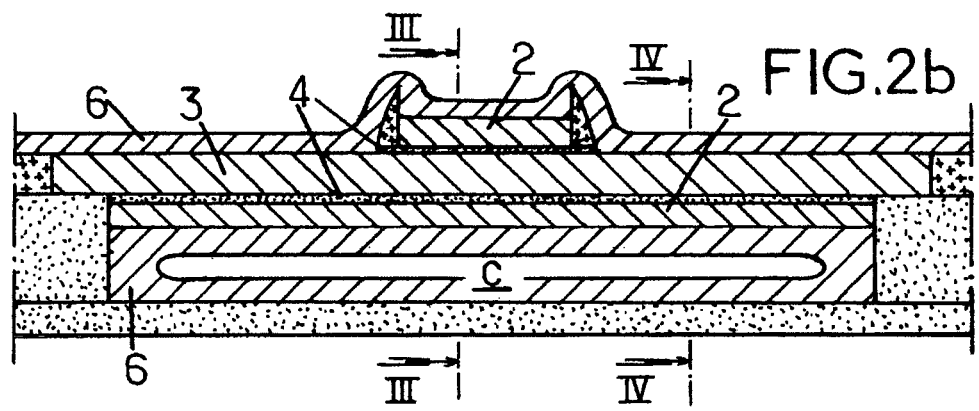
Figure 3B:
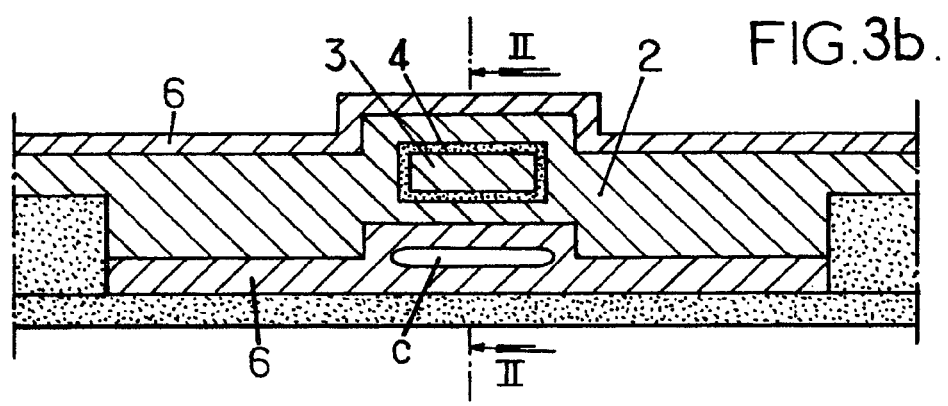
Figure 4B:
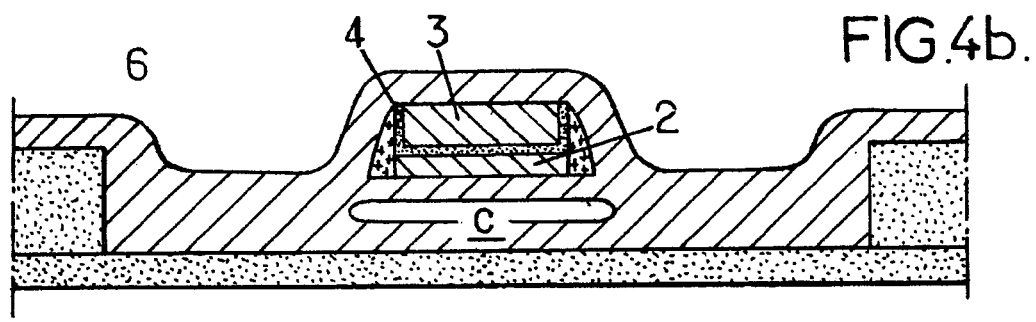

FIGS. 2b, 3b and 4b are sections corresponding to FIGS. 2a, 3a and 4a, respectively, and show the transistor 1 after the metal has been deposited. The deposited metal forms a continuous layer 6 covering the upper, lateral and lower faces of the two transverse structures, the bottom of the depression formed by the silica layer 101, the various parts of the silicon nitride spacer 5 and the silica rim 102 on its vertical and horizontal faces.

The metal employed for the layer 6 may in particular be cobalt.

The transistor 1 is then heated to a temperature suitable for forming a compound of the metal silicide type. This compound is formed in the silicon and/or polysilicon regions present at the surface of the transistor 1 or inside the cavity C, in contact with the layer 6. These silicon-metal 6 contact regions are the upper surfaces of the ends S and D of the bar 3, and the upper, lower and lateral surfaces of the volume 2.

The heating temperature, which depends on the metal of the layer 6, is for example between 500° C. and 700° C. During heating, metal from the layer 6 diffuses into the silicon of the aforementioned regions, starting from their surfaces, and silicon diffuses into the layer 6, forming a volume of mixed silicon-metal composition around the initial contact surface between the silicon and the metal. This mixed composition essentially corresponds to a compound of metal silicide type, which is electrically conducting. In the particular case of cobalt, the volume finally occupied by the silicide compound is about 3.5 times the volume occupied by the initial silicon converted into cobalt silicide.

Figure 2C:
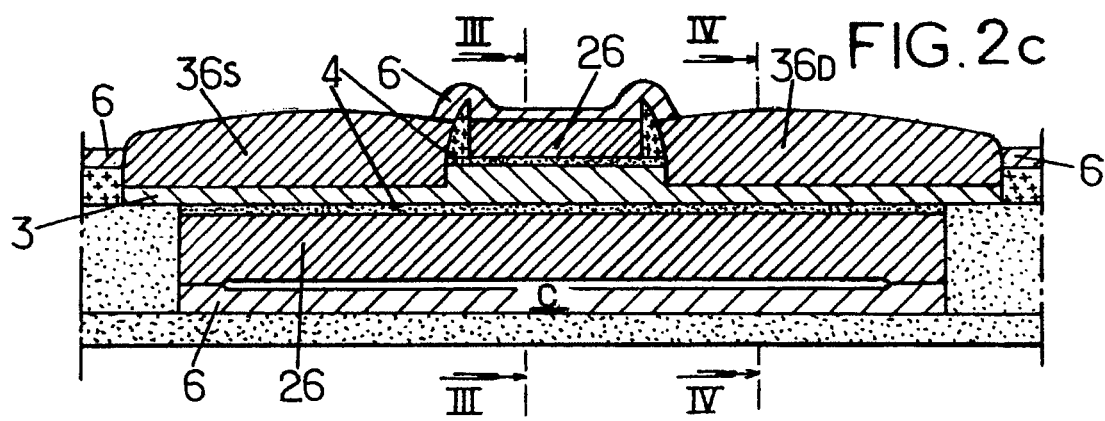
Figure 2D:
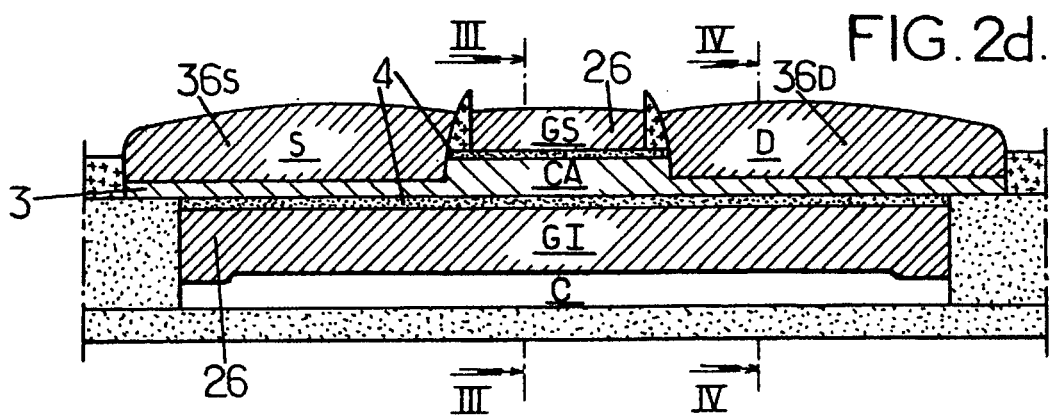
Figure 3C:
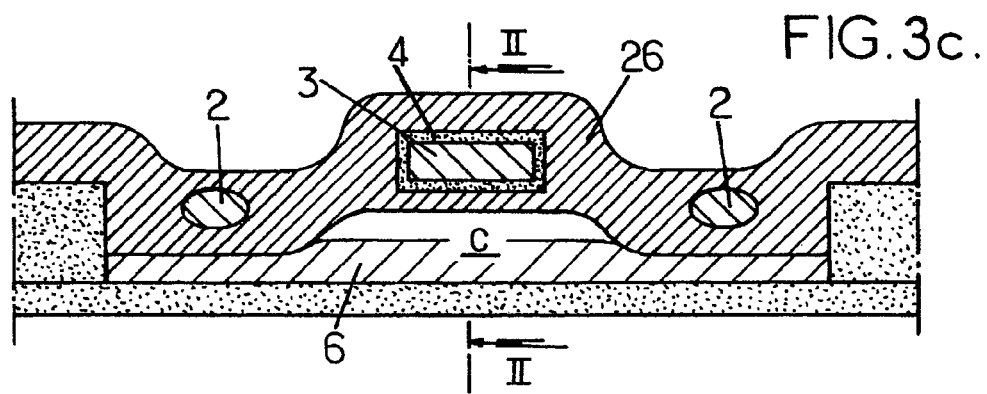
Figure 3D:
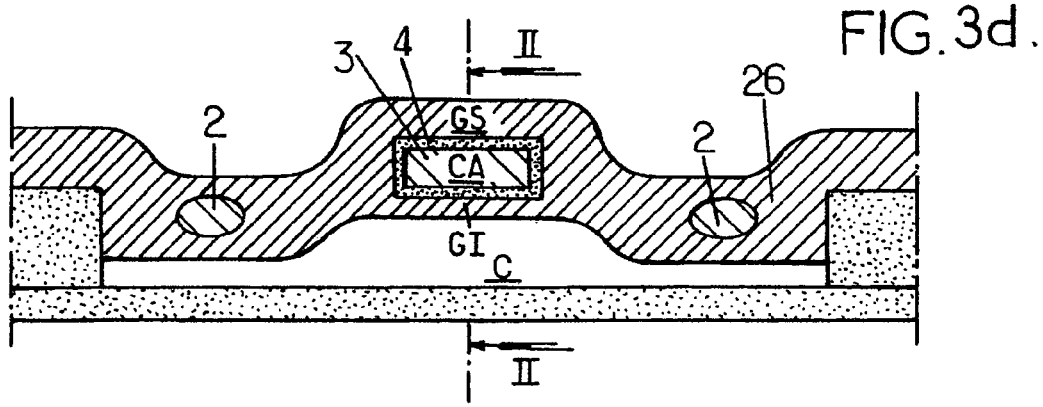
Figure 4C:
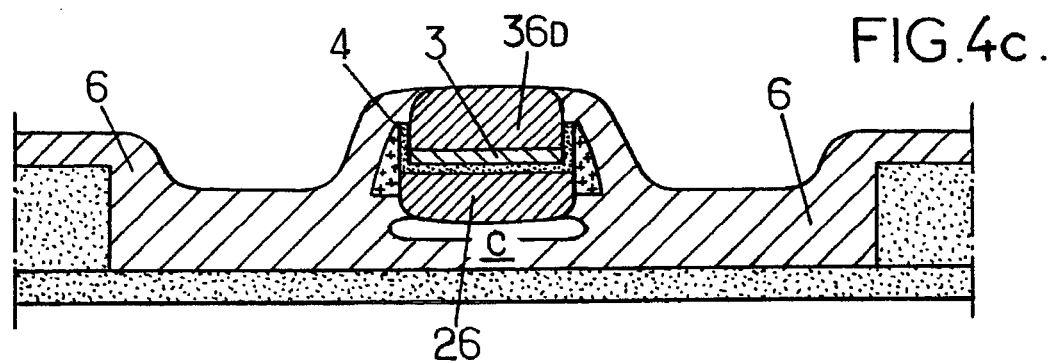
Figure 4D:
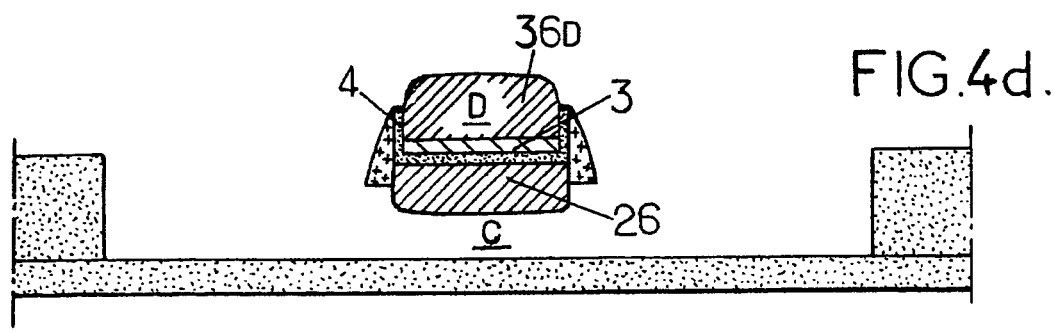
Figure 5:
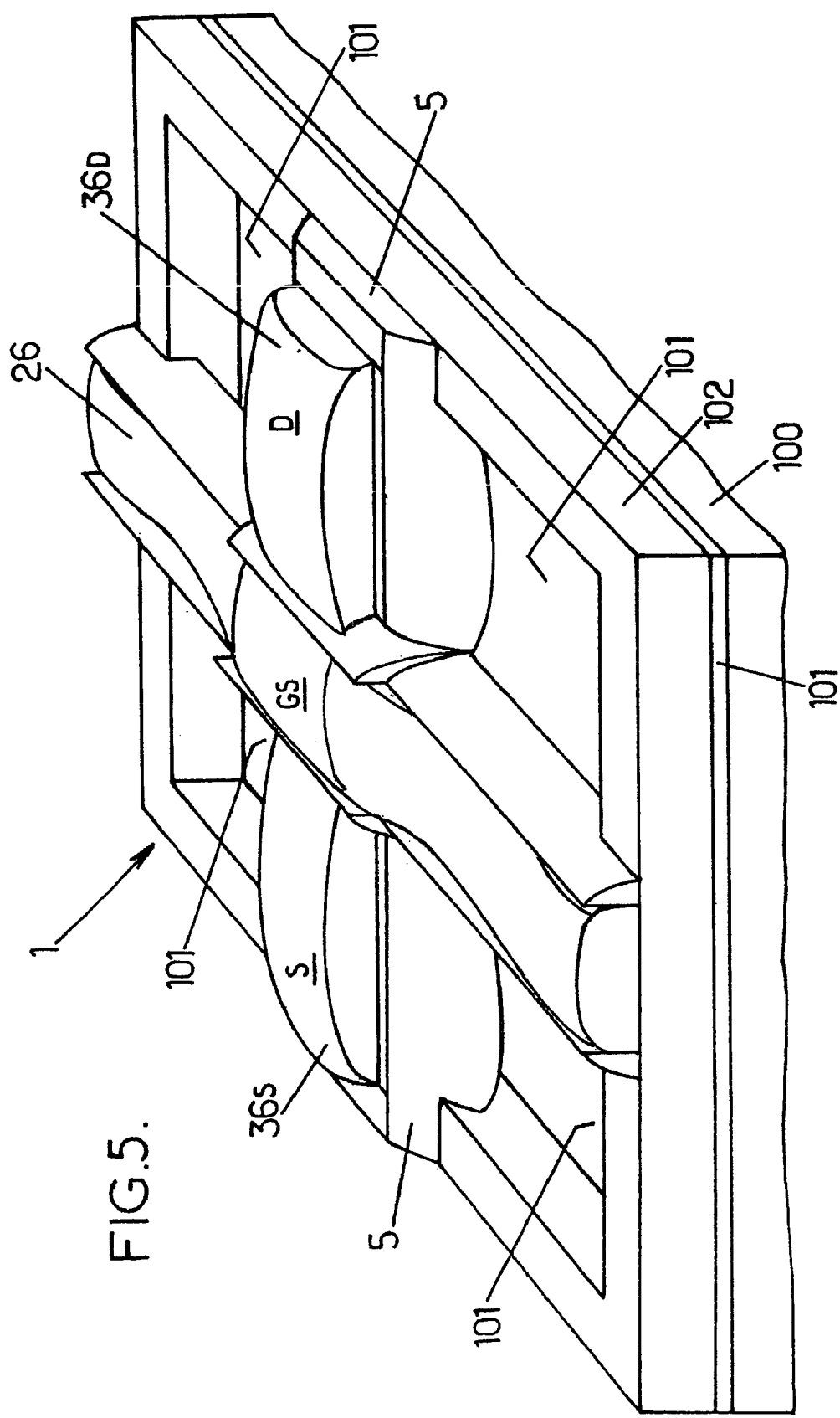
FIG. 5 is a perspective view of this transistor in the state shown in FIGS. 2d, 3d and 4d.

FIGS. 2c, 3c and 4c show the metal silicide portions 26, 36S and 36D formed, namely on top of the bar 3 and over the entire exposed surface of the initial volume 2, that is to say the upper surface of the volume 2, the sides and the lower surface (inside the cavity) of the volume 2. The rounded shapes shown correspond to the increase in volume of the materials involved in the silicide formation reaction.

Optionally, residual silicon portions of the volume 2 may remain within the silicide formed, these being shown in FIG. 3c, but preferably the amount of metal of the layer 6 is sufficient to allow all, or almost all, of the silicon of the volume 2 to be converted into silicide.

By contrast, the thickness of the bar 3 in the direction N is sufficient for only a limited fraction of the silicon of the bar 3 to be converted into silicide, thus forming an upper silicide coating on the ends S and D of the bar 3.

Those parts of the metal layer 6 that have not formed a silicide are then removed using a selective removal process known to those skilled in the art. This removal is preferably carried out by isotropic chemical etching using a liquid solution incorporating chemical reactants selected for specifically dissolving the metal 6. Acid reactants, possibly having a combined oxidizing effect, such as nitric acid $HNO_3$, are particularly suitable. During this removal, the liquid solution dissolves the metal and advances into the cavity C via the space left free by the dissolved metal, until the entire residual space of the cavity C has been filled and the residues of the metal layer 6 in it have been completely dissolved.

FIGS. 2d, 3d, 4d and 5 show the transistor 1 after this removal. The silicide portions 36S and 36D form the electrical contacts in the source region S and drain region D of the transistor 1, respectively. The silicide volume 26 also constitutes the gate surrounding the channel CA, with the upper part GS and lower part GI of this gate.

This gate is extended by silicide lands as far as the opposed sides of the rim 102 (FIGS. 3d and 5), these replacing the two ends of the second initial transverse structure. These lands may serve in particular as electrical connections, connecting the gate to components external to the transistor 1. In addition, the gate has two other extensions under the ends of the source S and the drain D of the bar 3, one of them being visible in FIG. 4d, contributing to particularly precise control of the electrical state of the transistor 1 obtained.

Cobalt was mentioned as an example of the metal 6. Any other metal capable of forming an electrically conducting silicide compound may also be used.

Preferably, the metal 6 is chosen in such a way that the corresponding silicide has a work function lying within a range of ±25% around the mean value of the two work functions of a p-doped silicon material and an n-doped silicon material respectively. For such a metal, n-type or p-type complementary MOS transistors, produced using the process described, have trigger voltages equal in absolute value but of opposite signs. Such opposite values of the trigger voltages simplify the design of electronic circuits comprising the two types of transistor.

Moreover, the siliciding process according to this first method of implementing the invention allows the gates of the two types of transistor to be produced simultaneously, these being distinguished beforehand by the type of the doping of their respective bars 3.

The process of the invention will now be illustrated by the description of a second method of implementation, particularly suitable for producing electrical connections between separate circuit portions.

FIG. 6 shows a plane substrate 100, for example made of silicon, covered with a layer for electrical insulation 101, for example made of silica $SiO_2$. The insulation layer 101 is itself covered by several portions of different materials, arranged as shown in the left-hand part of FIG. 6.

A portion of a temporary material 110 may comprise, for example, a silicon-germanium alloy similar to that used in the first method of implementing the process of the invention described above. On one side of the portion of temporary material 110, a first silicon portion 10a formed on the insulation layer 101 is contiguous with the portion 110, over about one half of the height of the portion 110. On the opposite side of the portion 110, a second silicon portion 15 is also contiguous with the portion 110, over the entire height of the latter. A volume 11 of silica $SiO_2$ completes the structure supported by the substrate 100 up to a uniform height, in the direction N, equal to the height of the portion 110 of temporary material.

A second planar substrate 200, possibly also made of silicon, supports a volume 12 of silica $SiO_2$ on its upper surface, with an intermediate silica layer 201. Several silicon portions 10b, 13a, 13b and 14 have been provided in the volume 12, using processes known to those skilled in the art, combining silicon deposition and etching/masking steps. These portions 10b, 13a, 13b and 14 are distributed within the volume 12, as shown in the right-hand part of FIG. 6.

The upper surfaces S1 and S2 of the structures supported by the substrates 100 and 200, respectively, are then polished so as to make them strictly planar and free of surface contamination.

The substrate 200 is then inverted and placed on top of the substrate 100 with the surface S2 applied against the surface S1. A bond is then formed between the materials of the surfaces S1 and S2, bonding the substrates 100 and 200 together, using the process called wafer bonding.

FIG. 7 shows the structure thus obtained. The substrate 200 is then removed by polishing, from its surface on the opposite side from the substrate 100 towards the S1/S2 bonding interface. Optionally, the silica layer 201 is also partially removed during this polishing. Its ablation is completed by selective plasma etching (or dry etching), for example by introducing a gas capable of etching silica, such as $C_4F_8$, into the plasma.

Next, a resist mask M is produced by lithography on top of the volume 12. The mask M has an opening O via which the upper surface of the volume 12 is exposed to a directional flux F of an etching plasma (FIG. 8).

The composition of this plasma may, in particular, be identical to that used to ablate the silica layer 201. A first volume V1 is thus etched away within the volume 12, forming a chimney for access to the portion 110 of temporary material (FIG. 9).

The opening O in the etching mask M has been positioned on the volume 12 in such a way that the chimney V1 reaches the silicon portion 10*b* at that end of this portion lying above the portion 110 of temporary material. The etching mask M is then removed.

A solution for selectively dissolving the silicon-germanium alloy of the portion 110 is then introduced via the chimney V1. This solution may be identical to that used in the first method of implementing the invention described above. The alloy of the portion 110 is then dissolved so as to form a second empty volume V2 (FIG. 10).

Figure 11:
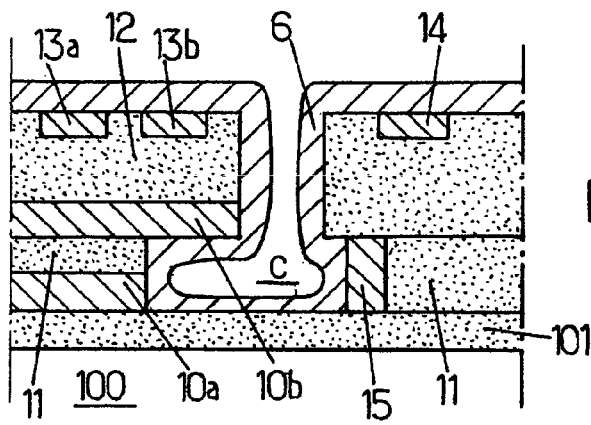

Next, a layer of metal 6, for example cobalt, is deposited over the entire structure obtained, so as to cover the upper surface of the volume 12 and the wall of the volumes V1 and V2, which join together to form a cavity C (FIG. 11).

Preferably, the metal is deposited at low pressure so as to obtain sufficient penetration, by diffusion, of the metal precursors used in this deposition into the cavity C. Thus, the entire wall of the cavity C is covered with metal, in sufficient quantity. Advantageously, the cavity C is not completely filled.

Figure 12:
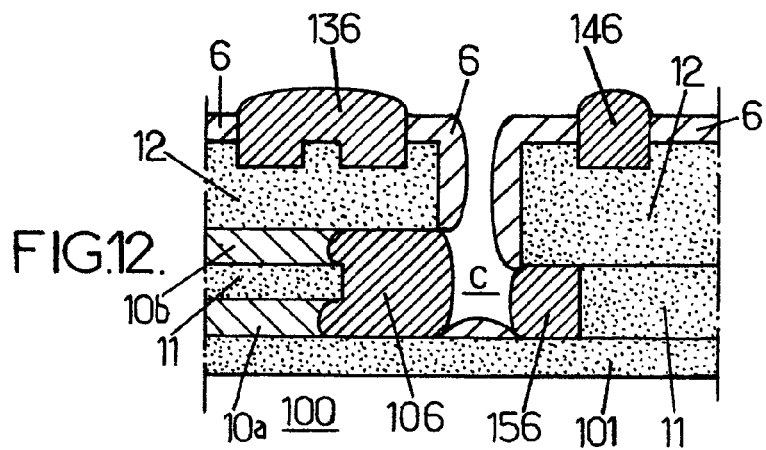

The substrate 100 is then heated to form a silicide at the surfaces of contact between the silicon and the layer of metal 6. The silicide is then formed on the parts of the wall of the cavity that are adjacent to the silicon volumes 10*a*, 10*b* and 15 (FIG. 12). Thanks to the part of the volume of the cavity C that has been left empty during deposition of the metal 6, no excessive stress is generated during formation of the silicide in the cavity C liable to disturb the arrangement of the various materials on the substrate 100.

Figure 13:
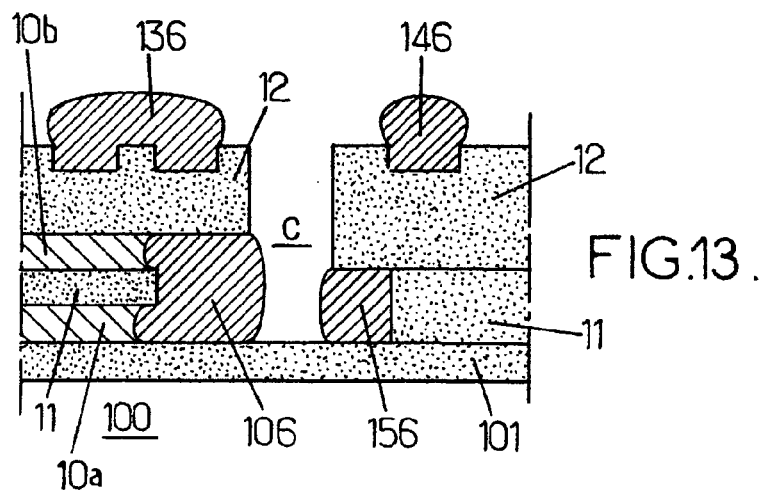

The metal 6 was deposited inside the cavity C in sufficient quantity so that, during heating to form the silicide, the silicon of the portion 15 is entirely converted into silicide so as to constitute the silicide portion 156 visible in FIGS. 12 and 13.

Moreover, the two silicon portions 10*a*, 10*b*, the ends of which face onto the cavity C, are initially isolated by a part of the silica volume 11. During the heating step, silicon atoms coming from these portions 10*a*, 10*b* diffuse into the deposited metal 6 and thus form a conducting bridge of silicide material 106 electrically connecting the two portions 10*a*, 10*b*.

This silicide bridge can then form an electrical connection between two electronic components, such as transistors, comprising one of the two silicon portions 10*a*, 10*b* respectively.

Likewise, outside the cavity C, the silicon portion 14 on the upper surface of the volume 12 is converted into a silicide portion 146, consuming all the silicon initially present in the portion 14, and a silicide connection 136 is furthermore established between the two upper silicon portions 13*a* and 13*b*.

No silicide formation reaction takes place on the other parts covered with metal 6, such as the upper surface and the portions of the wall of the cavity that are adjacent to the silicon volume 12, together with the bottom of the cavity C formed by the insulation layer 101. The process therefore allows silicide portions to be formed selectively in regions characterized by the presence of silicon. Outside these regions, the presence of silica $SiO_2$ inhibits silicide formation. Silicon nitride $Si_3N_4$ or any other material different from pure silicon, or silicon incorporating a small proportion of foreign atoms, also prevents silicide formation.

The excess metal 6 is finally removed by chemically dissolving it using a suitable etching solution, in the manner described above. The configuration in FIG. 13 is then obtained, which has two contact regions 146 and 156 and two connections 106 and 136. Thanks to the process of the invention, these contact regions and these connections have been produced simultaneously in parts of the circuit that are separate and distributed in any fashion, according to the design of the circuit.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A process for forming at least one portion of a compound material formed from elements of an initial material and of a metal within an electronic circuit, comprising the following steps:
    (a) formation of a cavity that includes at least one opening onto an access surface and has an internal wall having at least one region of initial material, wherein the cavity comprises a cylindrical or parallelepipedal first volume open to the access surface, and wherein the cavity furthermore comprises a second volume into which the first volume runs on an opposite side from the access surface, the second volume extending laterally away from the first volume in a direction parallel to the access surface;
    (b) deposition of the metal close to said region of initial material;
    (c) heating of the circuit so as to form a portion of compound material in said region of initial material; and
    (d) removal of at least one portion of the metal that has not formed some of the compound material from the cavity via said opening.

2. The process according to claim 1, wherein step (a) comprises the removal of at least one material from the circuit.

3. The process according to claim 1, wherein step (a) comprises the transfer of at least one material from association with a temporary substrate to association with a final substrate carrying the electronic circuit.

4. The process according to claim 1, wherein the initial material comprises silicon, germanium, arsenic, selenium, or a mixed compound comprising at least one of the above elements.

5. The process according to claim 1, wherein step (b) comprises introducing the metal into the cavity via the opening so as to form a deposition of the metal on at least said region of initial material.

6. The process according to claim 1, wherein step (b) comprises depositing the metal outside the cavity close to said opening and wherein, during step (c), the metal diffuses into the cavity, via said opening of the cavity, as far as said region of initial material, so as to form a portion of the compound material in said region of initial material.

7. The process according to claim 1, wherein step (b) comprises a chemical deposition of the metal from gaseous precursor compounds incorporating atoms of the metal, or a deposition using a liquid solution introduced into the cavity and incorporating dissolved chemical compounds based on the metal in an oxidized form.

8. The process according to claim 1, wherein the metal comprises cobalt, tantalum, tungsten, titanium, aluminum, copper, silver, platinum, nickel or an alloy comprising at least one of the above metals.

9. The process according to claim 1, wherein the compound material formed is electrically conducting.

10. The process according to claim 1, wherein step (d) comprises an etching by means of a solution including chemical reactants.

11. The process according to claim 1, wherein, during step (c), substantially all the initial material present in said region of initial material is converted into compound material.

12. The process according to claim 1, wherein the internal wall of the cavity has at least two regions of initial material separated by an intermediate region of a material other than the initial material and wherein, during step (c), the initial material of at least one of said regions of initial material is made to diffuse into the metal so as to form a portion of compound material connecting said regions of initial material.

13. The process according to claim 1, wherein the internal wall of the cavity has a region of silica or of silicon nitride.

14. The process according to claim 1, wherein the portion of compound material comprises at least one electrical connection of the electronic circuit.

15. The process according to claim 1, wherein the portion of compound material comprises a gate of an MOS transistor.

16. The process according to claim 15, wherein the compound material has a work function within a range of ±25% around a mean value of two work functions of a p-type semiconductor material and an n-type semiconductor material, respectively.

17. The process according to claim 1, wherein the compound material is formed in the second volume of the cavity.

18. The process according to claim 1, wherein the second volume underlies and is wider than the first volume in a plane parallel to the access surface.

* * * * *

UNITED STATES PATENT AND TRADEMARK OFFICE
CERTIFICATE OF CORRECTION

| | | |
|---|---|---|
| PATENT NO. | : 7,188,411 B2 | Page 1 of 1 |
| APPLICATION NO. | : 10/657514 | |
| DATED | : March 13, 2007 | |
| INVENTOR(S) | : Philippe Coronel et al. | |

It is certified that error appears in the above-identified patent and that said Letters Patent is hereby corrected as shown below:

In the Specification:

At column 4, line number 8, please add -- precaution is taken so as to avoid any damage to the -- before the word 'electronic'.

At column 6, line number 47, please add -- transverse structures and has access openings O lying -- after the word 'two'.

Signed and Sealed this
Thirteenth Day of September, 2011

David J. Kappos
*Director of the United States Patent and Trademark Office*